United States Patent
Park et al.

(10) Patent No.: US 10,508,189 B2
(45) Date of Patent: Dec. 17, 2019

(54) POWER INDUCTOR

(71) Applicant: MODA-INNOCHIPS CO., LTD., Ansan-Si, Gyeonggi-Do (KR)

(72) Inventors: In Kil Park, Seongnam-Si (KR); Gyeong Tae Kim, Ansan-Si (KR); Seung Hun Cho, Siheung-Si (KR); Jun Ho Jung, Siheung-Si (KR); Ki Joung Nam, Siheung-Si (KR); Jung Gyu Lee, Seoul (KR)

(73) Assignee: MODA-INNOCHIPS CO., LTD. (KR)

( * ) Notice: Subject to any disclaimer, the term of this patent is extended or adjusted under 35 U.S.C. 154(b) by 0 days.

(21) Appl. No.: 15/509,849

(22) PCT Filed: Apr. 27, 2015

(86) PCT No.: PCT/KR2015/004136
§ 371 (c)(1),
(2) Date: Mar. 8, 2017

(87) PCT Pub. No.: WO2016/039516
PCT Pub. Date: Mar. 17, 2016

(65) Prior Publication Data
US 2017/0263370 A1    Sep. 14, 2017

(30) Foreign Application Priority Data

Sep. 11, 2014 (KR) .................. 10-2014-0120128
Mar. 9, 2015 (KR) .................. 10-2015-0032402

(51) Int. Cl.
*H01F 27/29* (2006.01)
*C08K 3/28* (2006.01)
(Continued)

(52) U.S. Cl.
CPC .............. *C08K 3/28* (2013.01); *B22F 1/0062* (2013.01); *B22F 1/02* (2013.01); *B22F 3/02* (2013.01);
(Continued)

(58) Field of Classification Search
CPC ......... H01F 27/2804; H01F 2027/2809; H01F 41/041
(Continued)

(56) References Cited

U.S. PATENT DOCUMENTS 5,712,047 A * 1/1998 Aso .......................... C25D 3/58
428/607
5,850,682 A   12/1998 Ushiro
(Continued)

FOREIGN PATENT DOCUMENTS

CN    1258373 A    6/2000
CN    1801412 A    7/2006
(Continued)

OTHER PUBLICATIONS

International Search Report and Written Opinion for PCT/KR2015/004136 dated Jun. 30, 2015.
(Continued)

*Primary Examiner* — Alexander Talpalatski
*Assistant Examiner* — Joselito S. Baisa
(74) *Attorney, Agent, or Firm* — Renaissance IP Law Group LLP

(57) ABSTRACT

In accordance with an exemplary embodiment, a power inductor includes a body, at least two bases disposed in the body, a plurality of coil patterns disposed on at least one surface of the at least two the base, respectively, and a connection electrode disposed on an outer portion of the body and connecting the at least two coils to each other.

14 Claims, 5 Drawing Sheets

(51) Int. Cl.

| | | |
|---|---|---|
| *H01F 17/00* | (2006.01) | |
| *H01F 17/04* | (2006.01) | |
| *H01F 27/00* | (2006.01) | |
| *B22F 1/00* | (2006.01) | |
| *B22F 1/02* | (2006.01) | |
| *B22F 3/02* | (2006.01) | |
| *B29C 43/02* | (2006.01) | |
| *B29C 65/00* | (2006.01) | |
| *C08K 3/04* | (2006.01) | |
| *C08K 3/08* | (2006.01) | |
| *C08K 3/22* | (2006.01) | |
| *C09K 5/14* | (2006.01) | |
| *C23C 18/16* | (2006.01) | |
| *C25D 7/12* | (2006.01) | |
| *H01F 27/34* | (2006.01) | |
| *H01F 41/02* | (2006.01) | |
| *H01F 41/04* | (2006.01) | |
| *H01F 41/10* | (2006.01) | |
| *H05K 1/18* | (2006.01) | |
| *H01F 27/22* | (2006.01) | |
| *H01F 27/28* | (2006.01) | |
| *B29L 31/34* | (2006.01) | |

(52) U.S. Cl.
CPC ............ *B29C 43/02* (2013.01); *B29C 65/002* (2013.01); *C08K 3/04* (2013.01); *C08K 3/08* (2013.01); *C08K 3/22* (2013.01); *C09K 5/14* (2013.01); *C23C 18/1637* (2013.01); *C23C 18/1653* (2013.01); *C25D 7/123* (2013.01); *H01F 17/0013* (2013.01); *H01F 17/04* (2013.01); *H01F 27/008* (2013.01); *H01F 27/292* (2013.01); *H01F 27/34* (2013.01); *H01F 41/0233* (2013.01); *H01F 41/041* (2013.01); *H01F 41/10* (2013.01); *H05K 1/181* (2013.01); *B22F 2301/35* (2013.01); *B22F 2302/25* (2013.01); *B22F 2302/45* (2013.01); *B29L 2031/34* (2013.01); *C08K 2003/0856* (2013.01); *C08K 2003/222* (2013.01); *C08K 2003/282* (2013.01); *C08K 2201/001* (2013.01); *C08K 2201/01* (2013.01); *H01F 27/22* (2013.01); *H01F 2017/048* (2013.01); *H01F 2027/2809* (2013.01); *H05K 2201/1003* (2013.01)

(58) Field of Classification Search
USPC .................................................. 336/192, 200
See application file for complete search history.

(56) References Cited

U.S. PATENT DOCUMENTS

| | | | |
|---|---|---|---|
| 5,889,445 A * | 3/1999 | Ritter | H03H 1/02 333/172 |
| 6,218,925 B1 | 4/2001 | Iwao | |
| 6,356,181 B1 | 3/2002 | Kitamura | |
| 6,515,556 B1 * | 2/2003 | Kato | H01P 5/10 333/116 |
| 6,768,410 B1 * | 7/2004 | Yazaki | H01F 17/0013 333/25 |
| 6,998,939 B2 | 2/2006 | Nakayama et al. | |
| 7,084,730 B2 | 8/2006 | Kitagawa | |
| 7,085,118 B2 | 8/2006 | Inoue et al. | |
| 7,408,435 B2 | 8/2008 | Nishikawa et al. | |
| 7,497,005 B2 | 3/2009 | Forbes et al. | |
| 7,652,554 B2 | 1/2010 | Moriai et al. | |
| 7,772,956 B2 | 8/2010 | Toi et al. | |
| 8,471,668 B2 * | 6/2013 | Hsieh | H01F 17/0013 336/200 |
| 8,514,539 B2 * | 8/2013 | Asakawa | H01F 17/0006 361/111 |
| 9,263,786 B2 * | 2/2016 | Suga | H01P 5/185 |
| 9,406,420 B2 | 8/2016 | Ohkubo et al. | |
| 9,490,059 B2 * | 11/2016 | Nishio | H01F 27/22 |
| 9,558,890 B2 * | 1/2017 | Hattori | H01G 4/308 |
| 9,576,711 B2 * | 2/2017 | Yoon | H01F 5/04 |
| 9,647,315 B2 * | 5/2017 | Yamatogi | H01P 5/187 |
| 9,899,143 B2 | 2/2018 | Kim et al. | |
| 2002/0033561 A1 * | 3/2002 | Kawaguchi | H01L 23/3737 264/500 |
| 2002/0105406 A1 | 8/2002 | Liu et al. | |
| 2003/0030994 A1 | 2/2003 | Takaya et al. | |
| 2003/0134612 A1 * | 7/2003 | Nakayama | H01F 17/0013 455/307 |
| 2005/0080346 A1 | 4/2005 | Gianchandani et al. | |
| 2007/0080769 A1 | 4/2007 | Thiel et al. | |
| 2008/0058652 A1 * | 3/2008 | Payne | A61B 5/0031 600/488 |
| 2009/0137067 A1 | 5/2009 | Forbes et al. | |
| 2010/0052838 A1 | 3/2010 | Matsuta et al. | |
| 2010/0301981 A1 | 12/2010 | Zeng et al. | |
| 2011/0007439 A1 | 1/2011 | Asakawa et al. | |
| 2011/0178574 A1 | 7/2011 | Hardy et al. | |
| 2011/0291790 A1 | 12/2011 | Okumura et al. | |
| 2011/0308072 A1 | 12/2011 | Ahn et al. | |
| 2012/0146757 A1 | 6/2012 | Tsai et al. | |
| 2012/0274432 A1 | 11/2012 | Jeong et al. | |
| 2012/0274435 A1 | 11/2012 | Jeong et al. | |
| 2013/0038417 A1 | 2/2013 | Kim et al. | |
| 2013/0082812 A1 * | 4/2013 | Yoo | H01F 5/003 336/200 |
| 2013/0162385 A1 * | 6/2013 | Kwak | H01F 17/0013 336/200 |
| 2013/0169401 A1 | 7/2013 | Lee et al. | |
| 2013/0181799 A1 * | 7/2013 | Deville | E21B 17/028 336/90 |
| 2013/0222101 A1 | 8/2013 | Ito et al. | |
| 2013/0307655 A1 | 11/2013 | Saito et al. | |
| 2013/0341758 A1 | 12/2013 | Lee et al. | |
| 2014/0001397 A1 | 1/2014 | Park et al. | |
| 2014/0022041 A1 | 1/2014 | Park et al. | |
| 2014/0022042 A1 | 1/2014 | Park et al. | |
| 2014/0028430 A1 * | 1/2014 | Lee | H01F 27/00 336/200 |
| 2014/0050001 A1 | 2/2014 | Inaba | |
| 2014/0077914 A1 | 3/2014 | Ohkubo et al. | |
| 2014/0132387 A1 | 5/2014 | Shin | |
| 2014/0176284 A1 | 6/2014 | Lee et al. | |
| 2014/0184374 A1 * | 7/2014 | Park | H01F 27/255 336/83 |
| 2014/0218150 A1 | 8/2014 | Cho et al. | |
| 2014/0333401 A1 * | 11/2014 | Esaki | H01F 1/26 336/83 |
| 2014/0333404 A1 | 11/2014 | Bae et al. | |
| 2014/0347773 A1 | 11/2014 | Park et al. | |
| 2015/0070120 A1 * | 3/2015 | Nishio | H01F 27/22 336/61 |
| 2015/0087945 A1 | 3/2015 | Ziaie et al. | |
| 2015/0116966 A1 * | 4/2015 | Lee | H01G 4/40 361/767 |
| 2015/0145616 A1 | 5/2015 | Kim | |
| 2015/0213960 A1 * | 7/2015 | Moon | H01G 4/10 361/270 |
| 2015/0255206 A1 | 9/2015 | Han et al. | |
| 2015/0325362 A1 | 11/2015 | Kumura et al. | |
| 2015/0340149 A1 | 11/2015 | Lee et al. | |
| 2015/0340150 A1 | 11/2015 | Nakamura et al. | |
| 2016/0055964 A1 | 2/2016 | Park et al. | |

FOREIGN PATENT DOCUMENTS

| | | |
|---|---|---|
| CN | 101017728 A | 8/2007 |
| CN | 201950034 U | 8/2011 |
| CN | 102969109 A | 3/2013 |
| CN | 103035354 A | 4/2013 |
| CN | 103180919 A | 6/2013 |
| CN | 103456458 A | 12/2013 |

(56) References Cited

FOREIGN PATENT DOCUMENTS

| | | |
|---|---|---|
| CN | 103515077 A | 1/2014 |
| CN | 103578708 A | 2/2014 |
| DE | 102005039379 A1 | 3/2007 |
| JP | H0432214 A | 2/1992 |
| JP | H0714715 A | 1/1995 |
| JP | 08097045 A | 4/1996 |
| JP | 08264323 A | 10/1996 |
| JP | 10241942 A | 9/1998 |
| JP | 11054336 A | 2/1999 |
| JP | 11150357 A | 6/1999 |
| JP | 11260618 A | 9/1999 |
| JP | 200157311 A | 2/2001 |
| JP | 2001338813 A | 12/2001 |
| JP | 2002231574 A | 8/2002 |
| JP | 2002305108 A | 10/2002 |
| JP | 2003297634 A | 10/2003 |
| JP | 2004056112 A | 2/2004 |
| JP | 200538872 A | 2/2005 |
| JP | 2005183952 A | 7/2005 |
| JP | 2006147901 A | 6/2006 |
| JP | 2006157738 A | 6/2006 |
| JP | 2006286934 A | 10/2006 |
| JP | 2006310812 A | 11/2006 |
| JP | 2007012969 A | 1/2007 |
| JP | 2007067214 A | 3/2007 |
| JP | 2007194474 A | 8/2007 |
| JP | 2008072073 A | 3/2008 |
| JP | 2008147403 A | 6/2008 |
| JP | 2009117479 A | 5/2009 |
| JP | 2009302386 A | 12/2009 |
| JP | 2010010536 A | 1/2010 |
| JP | 2010080550 A | 4/2010 |
| JP | 2010153445 A | 7/2010 |
| JP | 2010209469 A | 9/2010 |
| JP | 2011018756 A | 1/2011 |
| JP | 2011504662 A | 2/2011 |
| JP | 2011077157 A | 4/2011 |
| JP | 2011258608 A | 12/2011 |
| JP | 2011530172 A | 12/2011 |
| JP | 2012089765 A | 5/2012 |
| JP | 2012109292 A | 6/2012 |
| JP | 2013042102 A | 2/2013 |
| JP | 2013098282 A | 5/2013 |
| JP | 2013521414 A | 6/2013 |
| JP | 2013239542 A | 11/2013 |
| JP | 2013251553 A | 12/2013 |
| JP | 2014011467 A | 1/2014 |
| JP | 2014013815 A | 1/2014 |
| JP | 2014013824 A | 1/2014 |
| JP | 2014503118 A | 2/2014 |
| JP | 5450565 B2 | 3/2014 |
| JP | 2014060284 A | 4/2014 |
| JP | 2014107548 A | 6/2014 |
| JP | 2014110425 A | 6/2014 |
| JP | 2014130988 A | 7/2014 |
| JP | 2016004917 A | 1/2016 |
| KR | 20070032259 A | 3/2007 |
| KR | 20120031754 A | 4/2012 |
| KR | 20120120819 A | 11/2012 |
| KR | 20120122589 A | 11/2012 |
| KR | 20120122590 A | 11/2012 |
| KR | 20130046108 A | 5/2013 |
| KR | 101338139 B1 | 12/2013 |
| KR | 20130135298 A | 12/2013 |
| KR | 101352631 B1 | 1/2014 |
| KR | 20140002355 A | 1/2014 |
| KR | 20140003056 A | 1/2014 |
| KR | 20140066437 A | 6/2014 |
| KR | 20140085997 A | 7/2014 |
| TW | 200915358 A | 4/2009 |
| TW | 201346951 A | 11/2013 |
| TW | 201346952 A | 11/2013 |
| WO | 2013042691 A1 | 3/2013 |
| WO | 2014087888 A1 | 6/2014 |

OTHER PUBLICATIONS

International Search Report and Written Opinion for PCT/KR2015/004137 dated Jun. 30, 2015.
International Search Report and Written Opinion for PCT/KR2015/004139 dated Jun. 29, 2015.
International Search Report and Written Opinion for PCT/KR2015/005454 dated Aug. 25, 2015.
International Search Report and Written Opinion for PCT/KR2015/008212 dated Nov. 17, 2015.
Extended European Search Report for Application No. 15829073.4 dated May 22, 2018.
Extended European Search Report for Application No. 15839158.1 dated May 24, 2018.
Extended European Search Report for Application No. 15839164.9 dated May 22, 2018.
Extended European Search Report for Application No. 15840080.4 dated Jun. 6, 2018.
Office Action for U.S. Appl. No. 15/502,501 dated Jun. 29, 2018.
Office Action for U.S. Appl. No. 15/502,502 dated Jun. 29, 2018.
Final Office Action for U.S. Appl. No. 15/502,502, dated Feb. 7, 2019.
Final Office Action for U.S. Appl. No. 15/509,850, dated Dec. 3, 2018.
Office Action for U.S. Appl. No. 15/502,501, dated May 31, 2019.

* cited by examiner

B-B'

700 : 710, 720

200 : 210, 220
300 : 310, 320, 330, 340
400 : 410, 420

POWER INDUCTOR

BACKGROUND

The present disclosure relates to a power inductor, and more particularly, to a power inductor that is capable of increasing a capacity thereof.

A power inductor is generally provided on a power circuit such as a DC-DC converter provided in portable devices. The power inductor is being increasingly used instead of an existing wound type choke coil pattern due to the tendency toward the high frequency and miniaturization of the power circuit. Also, the power inductor is being developed for miniaturization, high current, and low resistance as small-sized and multifunctional portable devices are required.

The power inductor may be manufactured in the form of a stacked body in which ceramic sheets formed of a plurality of ferrites or a low-k dielectric are stacked Here, a metal pattern is form in a coil pattern shape on each of the ceramic sheets. The coil patterns formed on the ceramic sheets are connected to each other by a conductive via formed on each of the ceramic sheets and have a structure in which the coil patterns overlap each other in a vertical direction in which the sheets are stacked. Typically, a body of the power inductor is manufactured by using a magnetic material including a quaternary system of nickel, zinc, copper, and iron.

However, since the magnetic material has a saturation magnetization less than that of a metal material, it may be difficult to realize high current characteristics that are recently required for portable devices. Thus, since the body of the power inductor is formed of metal powder, the saturation magnetization may increase in comparison with a case in which the body is formed of a magnetic material. However, when the body is formed of a metal, a loss of material may increase due to an increase in loss of eddy current and hysteria in a high frequency. To reduce the loss of the material, a structure in which the metal powder is insulated from each other by using a polymer is being applied.

However, the power inductor including the body formed of the metal powder and the polymer may decrease in inductance due to an increase in temperature. That is, the power inductor increases in temperature by heat generated from portable devices to which the power inductor is applied. As a result, while the metal power forming the body of the power inductor is heated, the inductance may decrease.

Also, in the above-described power inductor, since one substrate is provided in the body, and coil patterns are formed on both surfaces of the substrate, it is limited to increase capacity thereof.

PRIOR ART DOCUMENTS

KR Patent Publication No. 2007-0032259

SUMMARY

The present disclosure provides a power inductor which is capable of improving thermal stability to prevent inductance from decreasing.

The present disclosure also provides a power inductor that is capable of improving capacity.

The present disclosure also provides a power inductor that is capable of improving magnetic permeability.

In accordance with an exemplary embodiment, a power inductor includes: a body; at least two bases disposed in the body; at least two coil patterns disposed on the at least two the base, respectively; and a connection electrode disposed on an outer portion of the body and connecting the at least two coils to each other.

The body may include metal powder, a polymer, and a thermal conductive filler.

The metal powder may include metal alloy powder including iron.

The metal powder may have a surface that is coated with at least one of a magnetic material and insulation material.

The thermal conductive filler may include at least one selected from the group consisting of MgO, AlN, and a carbon-based material.

The thermal conductive is contained in a content of approximately 0.5 wt % to approximately 3 wt %, based on approximately 100 wt % of the metal powder.

The thermal conductive filler may have a size of approximately 0.5 μm to approximately 100 μm.

The base may be formed by bonding a copper foil to both surfaces of a metal plate comprising iron.

The power inductor may further include an insulating layer disposed on the coil and an external electrode spaced from the connection electrode, disposed on outer portion of the body, and connected to the coil.

The power inductor may further include a magnetic layer disposed on at least one area of the body.

The magnetic layer may have magnetic permeability higher than that of the body.

The magnetic layer may include the thermal conductive filler.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present disclosure may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1:
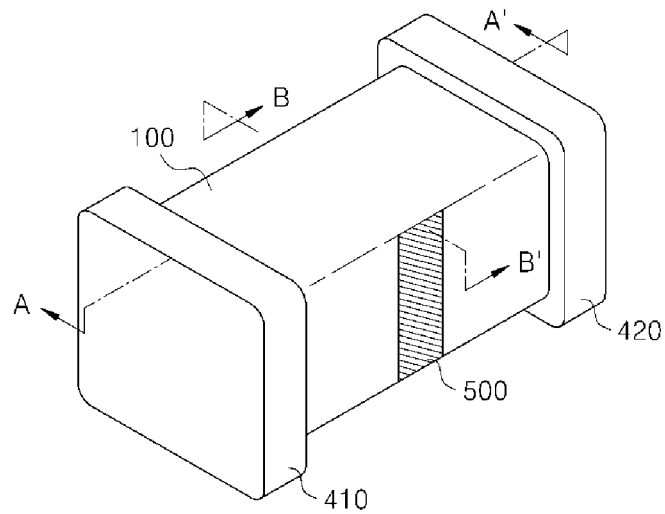
FIG. 1 is a perspective view of a power inductor in accordance with an exemplary embodiment.
Figure 2:
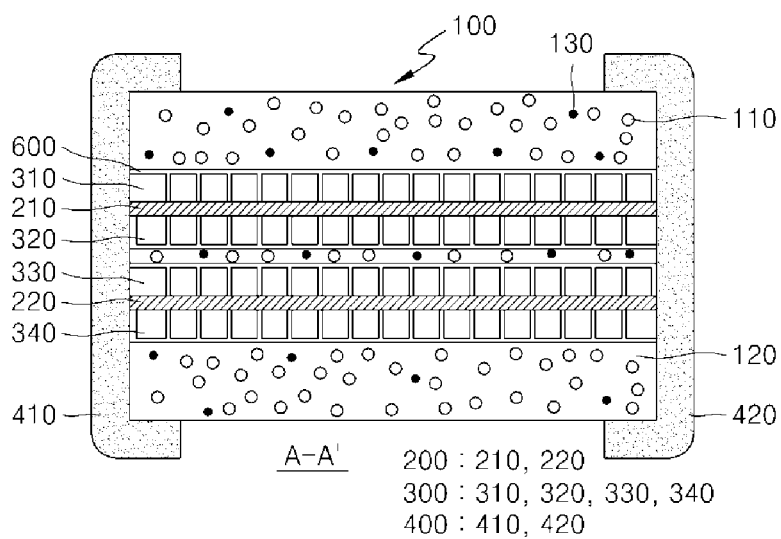
FIGS. 2 and 3 are cross-sectional views taken along lines A-A' and B-B' of FIG. 1, respectively.
Figure 3:
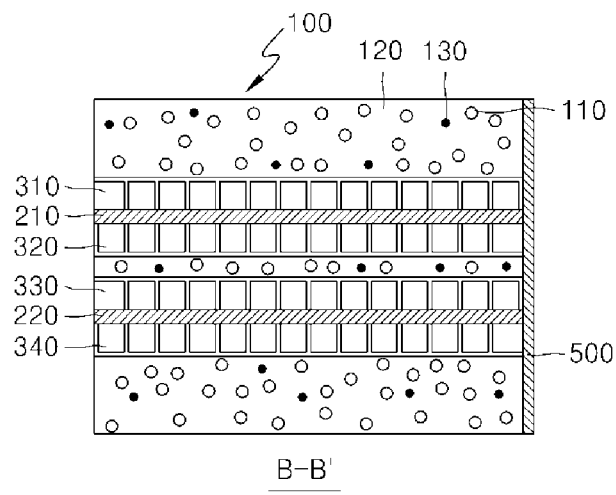

FIG. 1 is a perspective view of a power inductor in accordance with an exemplary embodiment, FIG. 2 is a cross-sectional view taken along line A-A' of FIG. 1, and FIG. 3 is a cross-sectional view taken along line B-B' of FIG. 1.

Referring to FIGS. 1 to 3, a power inductor in accordance with an exemplary embodiment may include a body 100, at least two bases 200 (210 and 220) provided in the body 100, coil patterns 300 (310, 320, 330, and 340) disposed on at least one surface of each of at least two bases 200, external electrodes 410 and 420 disposed on an outer portion of the body 100, and a connection electrode 500 disposed to be spaced apart form the external electrodes 410 and 420 on the outer portion of the body and connected to at least one coil pattern 300 disposed on each of the at least two bases 200 in the body.

The body 100 may have, for example, a hexahedral shape. The body 100, however, may have a polyhedral shape in addition to the hexahedral shape. The body 100 may include metal powder 110, a polymer 120, and a thermal conductive filler 130. The body 100 may be formed of the metal powder 110, the polymer 120, and the thermal conductive filler 130. The metal powder 110 may have a mean particle diameter of approximately 1 µm to approximately 50 µm. Also, the metal powder 110 may use a single kind of particles or at least two kinds of particles having the same size and a single kind of particles or at least two kinds of particles having a plurality of sizes. For example, a first metal particle having a mean size of approximately 30 µm and a second metal particle having a mean size of approximately 3 µm may be mixed with each other for using. When at least two kinds of metal powder 110 having sizes different from each other are used, the body 100 may increase in filling rate to maximize capacity. For example, when metal powder having a size of approximately 30 µm is used, a pore may be generated between the metal powder having the size of approximately 30 µm, resulting in decreasing the filling rate. However, since metal power having a size of approximately 3 µm is mixed between the metal power having the size of approximately 30 µm, the filling rate may further increase. The metal powder 110 may use a metal material including iron (Fe). For example, the metal powder 110 may include at least one metal selected from the group consisting of iron-nickel (Fe—Ni), iron-nickel-silica (Fe—Ni—Si), iron-aluminum-silica (Fe—Al—Si), and iron-aluminum-chrome (Fe—Al—Cr). That is, since the metal powder 110 includes the iron, the metal powder 110 may be formed as a metal alloy having a magnetic structure or magnetic property to have predetermined magnetic permeability. Also, a surface of the metal powder 110 may be coated with a magnetic material having magnetic permeability different from that of the metal powder 110. For example, the magnetic material may be formed of a metal oxide magnetic material. That is, the magnetic material may be formed of at least one oxide magnetic material selected from the group consisting of a nickel-oxide magnetic material, a zinc-oxide magnetic material, a copper-oxide magnetic material, a manganese-oxide magnetic material, a cobalt-oxide magnetic material, a barium-oxide magnetic material, and a nickel-zinc-copper oxide magnetic material. The magnetic material applied on the surface of the metal powder 110 may be formed of a metal oxide including iron and have a magnetic permeability greater than that of the metal powder 110. Furthermore, the surface of the metal powder 110 may be coated at least with at least one insulating material. For example, the surface of the metal powder 110 may be coated with an oxide and an insulating polymer such as parylene. The oxide may be formed by oxidizing the metal powder 110 or be coated with one selected from the group consisting of $TiO_2$, $SiO_2$, $ZrO_2$, $SnO_2$, NiO, ZnO, CuO, CoO, MnO, MgO, $Al_2O_3$, $Cr_2O_3$, $Fe_2O_3$, $B_2O_3$, and $Bi_2O_3$. Also, the surface of the metal powder 110 may be coated by using various insulating polymer materials in addition to the parylene. Here, the metal powder 110 may be coated with oxide having a double-layered structure or a double-layered structure of oxide and polymer materials. Alternatively, the surface of the metal powder 110 may be coated with the magnetic material and then the insulating material. As described above, the surface of the metal powder 110 may be coated with the insulating material to prevent a short-circuit due to the contact of the metal powder 110 from occurring. The polymer 120 may be mixed with the metal powder 110 so that the metal powder 110 is insulated with each other. That is, the metal powder 110 may increase in loss of eddy current and hysteria in a high frequency to cause a loss of the material. To reduce the loss of the material, the polymer 120 may be provided to insulate the metal powder 110 from each other. Although the polymer 120 is selected from the group consisting of epoxy, polyimide, and a liquid crystalline polymer (LCP), the present disclosure is not limited thereto. The polymer 120 may include a thermosetting resin to give an insulation property to the metal powder 110. The thermosetting resin may include at least one selected from the group consisting of a novolac epoxy resin, a phenoxy type epoxy resin, a BPA type epoxy resin, a BPF type epoxy resin, a hydrogenated BPA epoxy resin, a dimer acid modified epoxy resin, a urethane modified epoxy resin, a rubber modified epoxy resin, and a DCPD type epoxy resin. Here, the polymer 120 may be contained in a content of approximately 2.0 wt % to approximately 5.0 wt %, based on 100 wt % of the metal powder. When the polymer 120 increases in content, a volume fraction of the metal powder 110 may decrease, and thus, it may be difficult to properly realize an effect for increasing the saturation magnetization, and the magnetic characteristics of the body 100, i.e., the magnetic permeability may decreases. When the polymer 120 decreases in content, a strong acid or strong alkaline solution used in a process for manufacturing the inductor may be permeated into the inductor to reduce the inductance characteristics. Thus, the polymer 120 may be contained within a range in which the saturation magnetization and inductance of the metal powder 110 do not decrease. Also, the thermal conductive filler 130 may be provided to solve the limitation in which the body 100 is heated by the external heat. That is, when the metal powder 110 of the body 100 is heated by the external heat, the thermal conductive filler 130 may release the heat of the metal powder 110 to the outside. Although the thermal conductive filler 130 includes at least one selected from the group consisting of MgO, AlN, and a carbon-based material, the present disclosure is not limited thereto. Here, the carbon-based material may include carbon and have various shapes. For example, the carbon-based material may include graphite, carbon black, graphene, graphite, and the like. Also, the thermal conductive filler 130 may be contained in a content of approximately 0.5 wt % to approximately 3 wt %, based on approximately 100 wt % of the metal powder 110. When the content of the thermal conductive filler 130 is below the above-described range, a heat dissipation effect may not be achieved. On the other hand, when the content of the thermal conductive filler 130 is above the above-described range, the magnetic permeability of the metal powder 110 may decrease. Also, the thermal conductive filler 130 may have, for example, a size of approximately 0.5 µm to approximately 100 µm. That is, the thermal conductive filler 130 may have a size greater or less than that of the metal powder 110. On the other hand, the body 100 may be manufactured by stacking a plurality of sheets formed of a material including the metal powder 110, the polymer 120, and the thermal conductive filler 130. Here, when the body 100 is manufactured by stacking the plurality of sheets, the thermal conductive fillers 130 in the sheets may have contents different from each other. For example, the more the thermal filters are away from the base 200 upward and downward, the content of the thermal conductive fillers 130 in the sheets may gradually increase in content. Also, as necessary, the body 100 may be formed by applying various processes such as a process of printing paste formed of a material including the metal powder 110, the polymer 120, and the thermal conductive filler 130 at a predetermined thickness or a process of filling the paste into a frame to compress the paste. Here, the number of sheets stacked for forming the body 100 or a thickness of the paste printed at the predetermined thickness may be determined to adequate number or thickness in consideration of electrical characteristics such as the inductance required for the power inductor The at least two bases 200 (210 and 220) may be provided in the body 100. For example, the at least two bases 200 may be provided in the body 100 in a longitudinal direction of the body 100 and spaced a predetermined distance from each other in a thickness direction of the body 100 The base 200, for example, may be formed of copper clad lamination (CCL), a metal magnetic material, or the like. Here, the base 200 is formed of the magnetic material to improve the magnetic permeability and easily realize the capacity. That is, the CCL is manufactured by bonding a copper foil to glass reinforced fiber. Thus, the CCL may not have the magnetic permeability to reduce the magnetic permeability of the power inductor. However, when the metal magnetic material is used as the base 200, the magnetic permeability of the power inductor may not be reduced because the metal magnetic material has the magnetic permeability. The base 200 using the metal magnetic material may be manufactured by bonding the copper foil to a plate that has a predetermined thickness and is formed of at least one metal selected from the group consisting of metal including iron such as, for example, iron-nickel (Fe—Ni), iron-nickel-silica (Fe—Ni—Si), iron-aluminum-silica (Fe—Al—Si), and iron-aluminum-chrome (Fe—Al—Cr). That is, an alloy formed of at least one metal including iron may be manufactured in the form of a plate having a predetermined thickness, and then the copper foil may be bonded to at least one surface of the metal plate to manufacture the base 200. Also, at least one conductive via (not shown) may be formed in a predetermined area of the base 200, and the coil patterns 310 and 320 respectively disposed on the upper and lower portions of the base 200 may be electrically connected to each other by the conductive via. The via (not shown) passing in a direction of a thickness of the base 200 may be formed, and then the conductive paste may be filled into the via to form the conductive via.

The coil patterns 300 (310, 320, 330, and 340) may be disposed on at least one surface, preferably, both surfaces of each of the at least two bases 200. The coil patterns 310 and 320 may be respectively disposed on upper and lower portions of the first base 210 and electrically connected by the conductive via formed in the first base. Similarly, the coil patterns 330 and 340 may be respectively disposed on upper and lower portions of the second base 220 and electrically connected by the conductive via formed in a second base. The plurality of coil patterns 300 may be disposed on a predetermined area of the base 200, e.g., disposed outward from a central portion thereof in a spiral shape, and the two coil patterns disposed on the base 200 may be connected to form one coil. That is, at least one magnetic layer 600 may be provided in the body 100. Here, the coil patterns 310 and 330 on the upper portion and the coil pattern 320 and 340 on the lower portion may have the same shape. Also, the plurality of coil patterns 300 may overlap each other. Alternatively, coil pattern 320 and 340 on the lower portion may overlap each other on an area in which the coil pattern 310 and 330 on the upper portion is not formed. The plurality of coil patterns 300 may be formed by a method such as, for example, screen printing, coating, deposition, plating, or sputtering. Although each of the plurality of coil patterns 300 and the conductive via is formed of a material including at least one of silver (Ag), cooper (Cu), and copper alloy, the present disclosure is not limited thereto. On the other hand, when the plurality of coil patterns 300 are formed through the plating process, the metal layer, for example, a copper layer may be formed on the base 200 by the plating process and then be patterned by a lithography process. That is, the copper layer may be formed by using the copper foil formed on a surface of the base 200 as a seed layer through the plating process and then be patterned to form the coil patterns 300. Alternatively, a photosensitive film pattern having a predetermined shape may be formed on the base 200, and the plating process may be performed to grow the metal layer from the exposed surface of the base 200, and then the photosensitive film may be removed to form the coil patterns 310 and 320 having a predetermined shape. Alternatively, the coil patterns 300 may be formed in a multi-layered shape. That is, a plurality of coil patterns may be further formed upward from the coil patterns 310 formed on the upper portion of the first base 210, and a plurality of coil patterns may be further formed downward from the coil patterns 320 formed on the lower portion of the second base 220. When the plurality of coil patterns 300 are formed in the multi-layered shape, an insulation layer may be formed between lower and upper layers, and a conductive via (not shown) may be formed in the insulation layer to connect the multi-layered coil patterns to each other The external electrodes 400 (410 and 420) may be formed on both ends of the body 100, respectively. For example, the external electrodes 400 may be formed on both side surfaces facing each other in the longitudinal direction of the body 100. The external electrodes 400 may be electrically connected to the coil patterns 300 of the body 100. That is, at least one end of the plurality of coil patterns 300 may be exposed to the outside, and the external electrode 400 may be connected to the exposed end of the plurality of coil patterns 300. For example, the coil pattern 310 may be connected to the coil patterns 310 and 330, and the coil pattern 320 may be connected to the coil patterns 320 and 340. The external electrodes 400 may be formed on both ends of the body 100 by dipping the body 100 into the conductive paste or through the various processes such as the printing, the deposition, and the sputtering. The external electrode 400 may be formed of an electro-conductive metal that is selected from the group consisting of gold, silver, platinum, copper, nickel, palladium, and an alloy thereof. Also, a nickel plated layer (not shown) or a tin plated layer (not shown) may be further formed on a surface of the external electrode 400.

The connection electrodes 500 may be disposed on at least one side surface, on which the external electrode 400 is not disposed, of the body 100. The connection electrode 500 is provided to connect at least one of the coil patterns 310 and 320 disposed on the first base 210 to at least one of the coil patterns 330 and 340 disposed on the second base 220. Accordingly, the coil patterns 310 and 320 disposed on the first base 210 and the coil patterns 330 and 340 disposed on the second base 220 may be electrically connected to each other by the connection electrode 500 on the outer portion of the body 100. The connection electrode 500 may be formed on one side surface of the body 100 by dipping the body 100 into a conductive paste or through various methods such as the printing, the deposition, and the sputtering. The connection electrode 500 may be a metal which is capable of giving electric conductivity. For example, the connection electrode 500 may include at least one metal selected from the group consisting of gold, silver, platinum, copper, nickel, palladium, and an alloy thereof. Here, a nickel plated layer (not shown) or a tin plated layer (not shown) may be further formed on a surface of the connection electrode 500.

Alternatively, an insulation layer 600 may be further formed between the plurality of coil patterns 300 and the body 100 to insulate the plurality of coil patterns 300 from the metal powder 110. That is, the insulation layer 600 may be formed on the upper and lower portions of the base 200 to cover the plurality of coil patterns 300. The insulation layer 600 may include at least one material selected from the group consisting of epoxy, polyimide, and a liquid crystal polymer. That is, the insulation layer 600 may be formed of the same material as the polymer 120 forming the body 100. Also, the insulation layer 600 may be formed by applying an insulating polymer such as parylene on the coil patterns 300. That is, the insulation layer 600 may be coated in a uniform thickness along stepped portions of the coil patterns 300. Alternatively, the insulation layer 600 may be formed on the coil patterns 300 and 320 by using the insulation sheet.

As above-described, in the power inductor in accordance with an exemplary embodiment, the at least two bases 200, each of which has at least one surface on which the coil pattern 300 is disposed, may be disposed in the body 100 to from the plurality of coils in one body 100, thereby increasing the capacity of the power inductor. The body 100 may include the metal powder 110, the polymer 120, and the thermal conductive filler 130. Accordingly, the heat of the body 100, which is generated by heating the metal powder 110, may be released to the outside to prevent the body 100 from increasing in temperature, and thus prevent the inductance from being reduced. Also, the base 200 inside the body 100 may be formed of the magnetic material to prevent the power inductor from being reduced in magnetic permeability FIG. 4 is a cross-sectional view of a power inductor in accordance with another exemplary embodiment.

Figure 4:
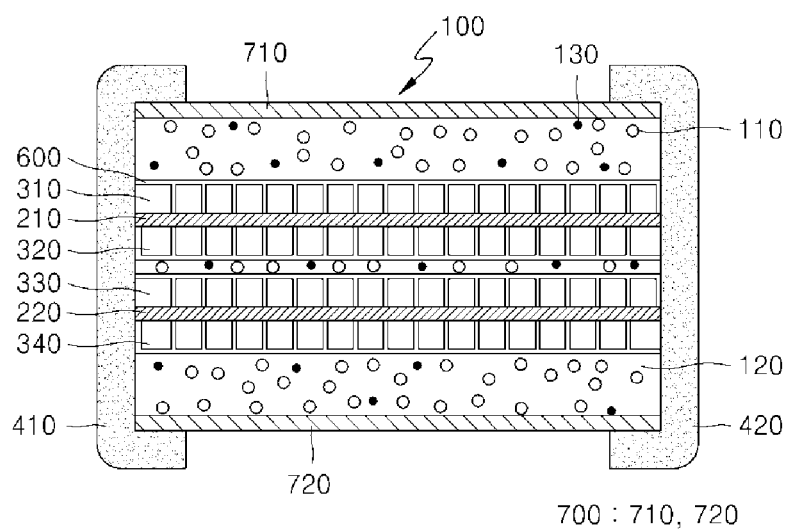
FIGS. 4 to 6 are cross-sectional views of a power inductor in accordance with other exemplary embodiments.

Referring to FIGS. 4 to 3, a power inductor in accordance with an exemplary embodiment may further include a body 100, at least two bases 200 (210 and 220) disposed in the body 100, coil patterns 300 (310, 320, 330, and 340) disposed on at least one surface of each of at least two base 200, external electrodes 410 and 420 disposed on outer portion of the body 100, a connection electrode 500 disposed on the outer portion of the body, spaced from the external electrodes 410 and 420, and connected to at least one coil pattern 300 formed on each of at least two base 200 in the body, and at least one of magnetic layers 710 and 720 respectively disposed on the upper and lower portions of the body 100. Also, the power inductor may further include an insulation layer 500 provided on each of the coil patterns 300.

The magnetic layer 700 (710 and 720) may be provided to at least one area of the body 100. That is, a first magnetic layer 710 may be disposed on a top surface of the body 100, and a second magnetic layer 720 may be disposed on a bottom surface of the body 100. Here, the first and second magnetic layers 710 and 720 may be provided to increase magnetic permeability of the body 100 and formed of a material having a magnetic permeability greater than that of the body 100. For example, the body 100 may have magnetic permeability of approximately 20, and each of the first and second magnetic layers 710 and 720 may have magnetic permeability of approximately 40 to approximately 1000. The first and second magnetic layers 710 and 720 may be formed of, for example, magnetic powder and a polymer. That is, the first and second magnetic layers 710 and 720 may be formed of a material having magnetism higher than that of the magnetic material of the body 100 or have a content of the magnetic material, which is higher than that of the magnetic material of the body 100 so that each of the first and second magnetic layers 710 and 720 has the magnetic permeability higher than that of the body 100 Here, the polymer may be contained in a content of approximately 15 wt %, based on approximately 100 wt % of the metal powder. Also, the magnetic material powder may use at least one selected from the group consisting of a nickel magnetic material (Ni Ferrite), a zinc magnetic material (Zn Ferrite), a copper magnetic material (Cu Ferrite), a manganese magnetic material (Mn Ferrite), a cobalt magnetic material (Co Ferrite), a barium magnetic material (Ba Ferrite), and a nickel-zinc-copper magnetic material (Ni—Zn—Cu Ferrite) or at least one oxide magnetic material thereof. That is, the magnetic layer 700 may be formed by using a metal alloy powder including iron or a metal alloy oxide including iron. Also, the magnetic powder may be formed by applying the magnetic material to the metal alloy powder. For example, the magnetic material powder may be formed by applying at least one magnetic material oxide selected from the group consisting of a nickel-oxide magnetic material, a zinc-oxide magnetic material, a copper-oxide magnetic material, a manganese-oxide magnetic material, a cobalt-oxide magnetic material, a barium-oxide magnetic material, and a nickel-zinc-copper oxide magnetic material to, for example, the metal alloy powder including iron. That is, the magnetic material powder may be formed by applying the metal oxide including iron to the metal alloy powder. Alternatively, the magnetic material powder may be formed by mixing at least one magnetic material oxide selected from the group consisting of a nickel-oxide magnetic material, a zinc-oxide magnetic material, a copper-oxide magnetic material, a manganese-oxide magnetic material, a cobalt-oxide magnetic material, a barium-oxide magnetic material, and a nickel-zinc-copper oxide magnetic material with, for example, the metal alloy powder including iron. That is, the magnetic material powder may be formed by mixing the metal oxide including iron with the metal alloy powder. On the other hand, each of the first and second magnetic layers 710 and 720 may further include the thermal conductive fillers in addition to the metal powder and polymer. The thermal conductive fillers may be contained in a content of approximately 0.5 wt % to approximately 3 wt %, based on approximately 100 wt % of the metal powder. The first and second magnetic layers 710 and 720 may be manufactured in a sheet shape and respectively disposed on upper and lower portions of the body 100 on which a plurality of sheets are stacked. Also, the body 100 may be formed by printing a paste formed of a material including metal powder 110, a polymer 120, and a thermal conductive filler 130 at a predetermined thickness or filling the paste into a frame to compress the paste, and then the first and second magnetic layers 710 and 720 may be respectively disposed on the upper and lower portions of the body 100. Alternatively, the magnetic layer 710 and 720 may be formed by using the paste, i.e., formed by applying the magnetic material to the upper and lower portions of the body 100

Figure 5:
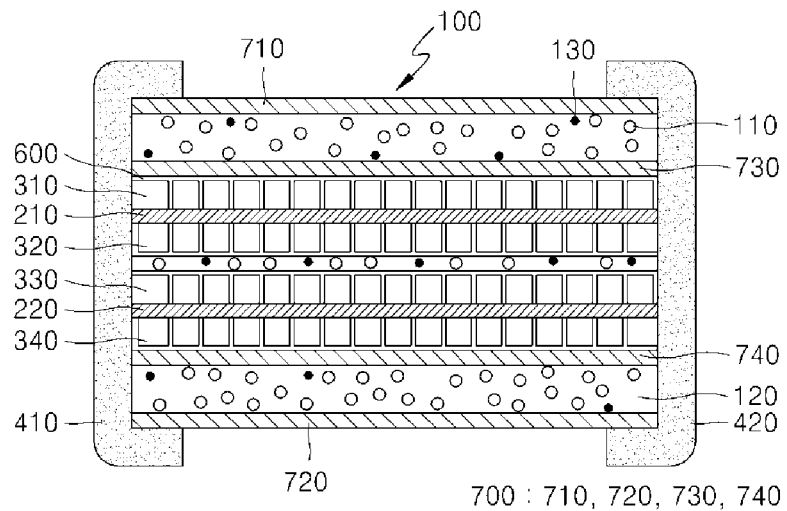
Figure 6:
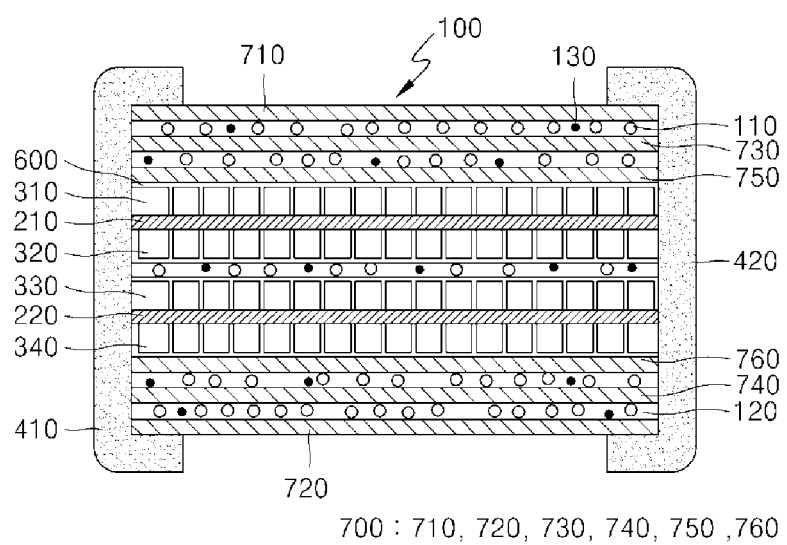

In accordance with another exemplary embodiment, a power inductor may further include third and fourth magnetic layers 730 and 740 on upper and lower portions between a body 100 and at least two bases 200 as illustrated in FIG. 5, and fifth and sixth magnetic layers 750 and 760 may be further provided therebetween as illustrated in FIG. 6. That is, at least one magnetic layer 700 may be provided in the body 100. The magnetic layers 700 may be manufactured in a sheet shape and provided in the body 100 in which a plurality of sheets are stacked. That is, at least one magnetic layer 700 may be provided between the plurality of sheets for manufacturing the body 100. Also, when the body 100 is formed by printing the paste formed of the material including the metal powder 110, the polymer 120, and the thermal conductive filler 130 at a predetermined thickness, the magnetic layer may be formed during the printing. Also, when the body 100 is formed by filling the paste into the frame to compress the paste, the magnetic layer may be inserted therebetween to compress the paste Alternatively, the magnetic layer 700 may be formed by using the paste, i.e., formed in the body 100 by applying a soft magnetic material during the printing of the body 100.

Figure 7:
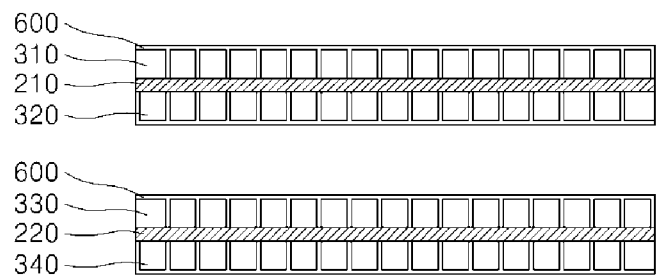
FIGS. 7 to 9 are cross-sectional views for explaining a method for manufacturing the power inductor in accordance with an exemplary embodiment.
Figure 8:
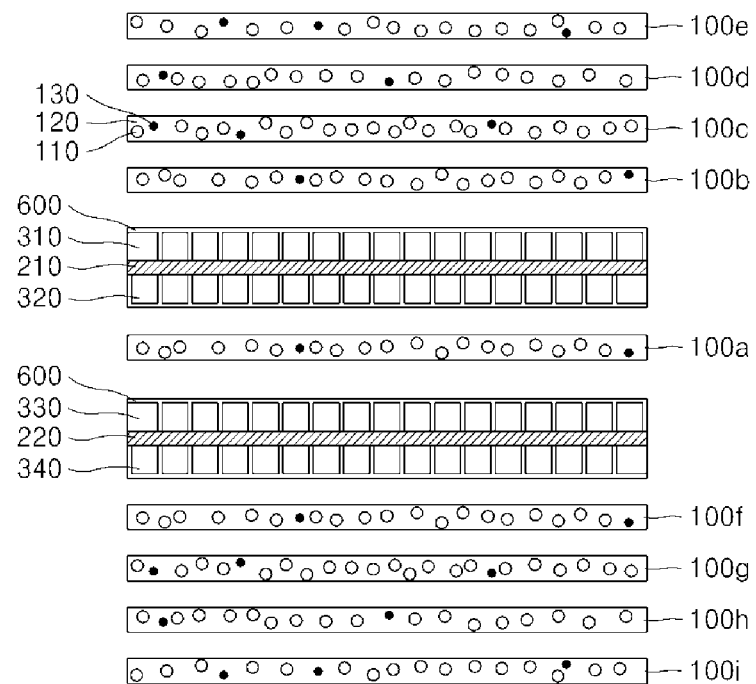
Figure 9:
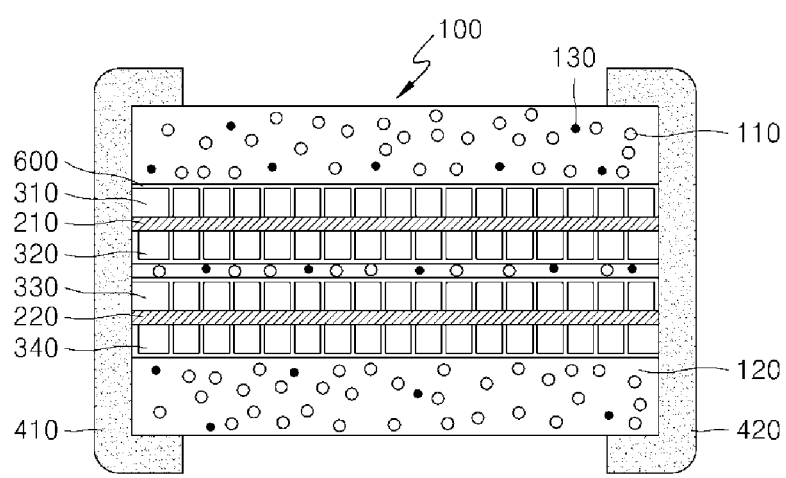

FIGS. 7 to 9 are cross-sectional views sequentially illustrating a method for manufacturing the power inductor in accordance with an exemplary embodiment.

Referring to FIG. 7, at least two bases 210 and 220 are provided, and the coil patterns 310, 320, 330, and 340, each of which has a predetermined shape. are formed on at least one surface, preferably, one surface and the other surface of the at least two bases 210 and 220. The bases 210 and 220 may be formed of CCL, a metal magnetic material, or the like. For example, the bases 210 and 220 may be formed of a metal magnetic material that is capable of improving effective magnetism and easily realizing capacity. For example, the bases 210 and 220 may be manufactured by bonding a copper foil to both surfaces of a metal plate which is formed of a metal alloy including iron and has a predetermined thickness. Also, the coil patterns 310, 320, 330, and 340 may be formed on a predetermined area of the bases 210 and 220, e.g., may be formed as a coil pattern that is formed from a central portion thereof in a circular spiral shape. Here, the coil pattern 310 and 330 may be formed on one surface of the bases 210 and 220, and then a conductive via passing through a predetermined area of the bases 210 and 220 and in which a conductive material is filled therein may be formed. Also, the coil patterns 320 and 340 may be formed on the other surface of the bases 210 and 220. The conductive via may be formed by filling conductive paste into a via hole after the via hole is formed in a thickness direction of the bases 210 and 220 by using laser For example, the coil patterns 310, 320, 330, and 340 may be formed through a plating process. For this, a photosensitive pattern having a predetermined shape may be formed on one surface of the first base 210 to perform the plating process using a copper foil as a seed on the first base 210. Then, a metal layer may be grown from the exposed surface of the first base 210, and then the photosensitive film may be removed. The coil patterns 320 may be formed on the other surface of the first base 210 by using the same manner as that for forming the coil pattern 310. Alternatively, the coil patterns 330 and 340 may be formed on the both surfaces of the second base 220 by using the same manner as that for forming the coil pattern 310 and 320. Alternatively, the coil patterns 310, 320, 330, and 340 may be formed in a multi-layered shape. When the coil patterns 310, 320, 330, and 340 are formed in the multi-layered shape, an insulation layer may be formed between lower and upper layers, and the conductive via (not shown) may be formed in the insulation layer to connect the multi-layered coil patterns to each other. The coil patterns 310, 320, 330, and 340 are formed on one surface and the other surface of the bases 210 and 220, respectively, and then the insulation layer 600 is formed to cover the coil patterns 310, 320, 330, and 340. The insulation layer 600 may be formed by closely attaching a sheet including at least one material selected from the group consisting of epoxy, polyimide, and a liquid crystal crystalline polymer to the coil patterns 310, 320, 330, and 340.

Referring to FIG. 8, a plurality of sheets 100a to 100h formed of a material including the metal powder 110, the polymer 120, and the thermal conductive filler 130 are provided. Here, the plurality of sheets 100a to 100i may be formed of a material further including the thermal conductive filler 130. The metal powder 110 may use a metal material including iron (Fe), and the polymer 120 may use epoxy, polyimide, or the like, which is capable of insulating the metal powder 110 from each other. Also, the thermal conductive filler 130 may use MgO, AlN, a carbon based material, or the like, which is capable of releasing heat of the metal powder 110 to the outside Also, the surface of the metal powder 110 may be coated with a magnetic material, for example, a metal oxide magnetic material. Here, the polymer 120 may be contained in a content of approximately 2.0 wt % to approximately 5.0 wt %, based on 100 wt % of the metal powder 110, and the thermal conductive filler 130 may be contained in a content of approximately 0.5 wt % to approximately 3.0 wt %, based on 100 wt % of the metal powder 110. The plurality of sheets 100a to 100i are disposed on the upper and lower portions and therebetween of at least two bases 210 and 220 on which the coil patterns 310, 320, 330, and 340 are formed, respectively. For example, at least one sheet 100a is disposed between at least two bases 210 and 220, a plurality of sheets 100b to 100e are disposed on an upper portion of the base 210, and a plurality of sheets 100f to 100i are disposed on a lower portion of the base 220. Here, the plurality of sheets 100a to 100i may have contents of thermal conductive fillers 130, which are different from each other. For example, the thermal conductive fillers 130 may have contents that gradually increase from one surface and the other surface of the base 200 toward the upper and lower sides of the base 200. That is, the thermal conductive filters 130 of the sheets 100c and 100f disposed on upper and lower portions of the sheets 100b and 100e contacting the bases 210 and 220 may have contents higher than those of the thermal conductive fillers 130 of the sheets 100b and 100e, and the thermal conductive fillers 130 of the sheets 100d and 100h disposed on upper and lower portions of the sheets 100c and 100f may have contents higher than those of the thermal conductive fillers 130 of the sheets 100c and 100f. Like this, the contents of the thermal conductive fillers 130 may gradually increase in a direction that is away from the bases 210 and 220 to further improve heat transfer efficiency Referring to FIG. 9, the plurality of sheets 100a to 100i are stacked and compressed with the at least two bases 210 and 220 therebetween and then molded to form the body 100. The external electrodes 400 may be formed so that the protruding portion of each of the coil patterns 310, 320, 330 and 340 is electrically connected to both ends of the body 100. The connection electrode 500 may be formed on at least one surface of the body, on which the external electrodes 400 are not formed, so that the connection electrode 500 is electrically connected to the protruding portion of each of the coil patterns 310, 320, 330, and 340. The external electrodes 400 may be formed by various processes including a process of dipping the body 100 into a conductive paste, a process of printing the conductive past on both ends of the body 10, a deposition process, and a sputtering process. Here, the conductive paste may use a metal material that is capable of giving electric conductivity to the external electrodes 400. Also, a nickel plated layer and a tin plated layer may be further formed on a surface of the external electrode 400, if necessary. Alternatively, the connection electrode 500 may be formed by the same method as the external electrodes 400. The connection electrode 500 and the external electrodes 400 may be formed at the same time, or the connection electrode 500 may be formed before or after the external electrodes 400 are formed.

In the power inductor in accordance with an exemplary embodiment, since the at least two bases each of which has at least one surface on which the coil pattern having a coil shape is formed are provided in the body, the plurality of coils may be formed in one body to increase the capacity of the power inductor. Also, the body may include the metal powder, the polymer, and the thermal conductive filler. Thus, the heat of the body, which is generated by heating the metal powder, may be released to the outside to prevent the body from increasing in temperature, thereby preventing the inductance from being reduced. Also, the at least two bases may be formed as the magnetic material to prevent the power inductor from decreasing in magnetic permeability.

The power inductor may not be limited to the foregoing embodiments, but be realized through various embodiments different from each other. Therefore, it will be readily understood by those skilled in the art that various modifications and changes can be made thereto without departing from the spirit and scope of the present invention defined by the appended claims.

What is claimed is:

1. A power inductor, comprising:
a body;
at least two bases disposed in the body;
at least two coils disposed on the at least two bases, respectively;
external electrodes disposed on two outer surfaces of the body which face each other in one direction, the external electrodes being connected to the at least two coils; and
a connection electrode disposed between the external electrodes and on at least one outer surface of the body, the connection electrode connecting the at least two coils to each other,
wherein the body comprises metal powder, a polymer, and a thermal conductive filler for discharging heat of the metal powder to the outside,
the metal powder has a mean particle size of 1 µm to 50 µm, and comprises a single kind of particles or two or more kinds of particles, which have a plurality of sizes,
a content of the thermal conductive filler gradually increases in a direction from the base toward upper and lower sides thereof,
wherein the connection electrode connects the at least two coils disposed on different bases of the at least two bases,
wherein the connection electrode directly contacts the at least two coils, and
wherein the connection electrode is formed only on a side surface of the body without extending to upper and lower surfaces of the body.

2. The power inductor of claim 1, wherein the metal powder comprises metal alloy powder comprising iron.

3. The power inductor of claim 2, wherein the metal powder has a surface that is coated with at least one of a magnetic material and an insulation material.

4. The power inductor of claim 1, wherein the thermal conductive filler comprises at least one selected from the group consisting of MgO, AlN, and a carbon-based material.

5. The power inductor of claim 4, wherein the thermal conductive filler is contained in a content of approximately 0.5 wt % to approximately 3 wt %, based on approximately 100 wt % of the metal powder.

6. The power inductor of claim 5, wherein the thermal conductive filler has a size of approximately 0.5 µm to approximately 100 µm.

7. The power inductor of claim 1, wherein the at least two bases are formed by bonding a copper foil to both surfaces of a metal plate comprising iron.

8. The power inductor of claim 1, further comprising an insulating layer disposed on each of the coils.

9. The power inductor of claim 1, further comprising a magnetic layer disposed on at least one area of the body.

10. The power inductor of claim 9, wherein the magnetic layer has magnetic permeability higher than that of the body.

11. The power inductor of claim 10, wherein the magnetic layer further comprises a thermal conductive filler.

12. A power inductor, comprising:
a body;
at least two bases disposed in the body;
at least two coils disposed on the at least two bases, respectively;
external electrodes disposed on two outer surfaces of the body which face each other in one direction, the external electrodes being connected to the at least two coils; and
a connection electrode spaced apart from the external electrodes and disposed on at least one outer surface of the body, the connection electrode connecting the at least two coils to each other,
wherein the body comprises metal powder, a polymer, and a thermal conductive filler for discharging heat of the metal powder to the outside,
the metal powder has a mean particle size of 1 µm to 50 µm, and comprises a single kind of particles or two or more kinds of particles, which have a plurality of sizes,
a content of the thermal conductive filler gradually increases in a direction from the base toward upper and lower sides thereof,
wherein the connection electrode connects the at least two coils disposed on different bases of the at least two bases,
wherein the connection electrode directly contacts the at least two coils, and
wherein the connection electrode is formed only on a side surface of the body without extending to upper and lower surfaces of the body.

13. The power inductor of claim 12, wherein each of the bases is formed by bonding a copper foil to both surfaces of a metal plate comprising iron.

14. The power inductor of claim 12, further comprising an insulating layer disposed on each of the coils.

* * * * *